United States Patent [19]

Watabe

[11] Patent Number: 4,760,659

[45] Date of Patent: Aug. 2, 1988

[54] DISPLAY PLATE FOR A PRINTED CIRCUIT BOARD

[75] Inventor: Noboru Watabe, Tokyo, Japan

[73] Assignee: NEC Corporation, Japan

[21] Appl. No.: 815,235

[22] Filed: Dec. 31, 1985

[30] Foreign Application Priority Data

Jan. 25, 1985 [JP] Japan ................................ 60-8883[U]
Sep. 9, 1985 [JP] Japan ............................ 60-138451[U]

[51] Int. Cl.$^4$ ........................... G09F 9/00; F16B 13/04
[52] U.S. Cl. ...................................... 40/124.1; 40/902; 40/489; 40/663; 411/41
[58] Field of Search ..................... 40/10 R, 442, 20 A, 40/902, 124.1, 489; 411/41

[56] References Cited

U.S. PATENT DOCUMENTS

| | | | |
|---|---|---|---|
| 3,573,558 | 4/1971 | Babcock | 317/101 |
| 3,585,742 | 6/1971 | Tyler | 40/10 R |
| 3,594,760 | 7/1971 | Haker | 40/902 |
| 3,754,245 | 8/1973 | Peprnik | 40/902 |
| 3,771,164 | 11/1973 | Bolick, Jr. | 40/10 R |
| 4,361,828 | 11/1982 | Hose | 40/489 |
| 4,375,342 | 3/1983 | Wollar et al. | 411/41 |
| 4,405,272 | 9/1983 | Wollar | 411/41 |
| 4,588,152 | 5/1986 | Ruehl et al. | 411/41 |
| 4,658,525 | 4/1987 | Nagahama et al. | 40/489 |

*Primary Examiner*—Carl D. Friedman
*Assistant Examiner*—Caroline D. Dennison
*Attorney, Agent, or Firm*—Laff, Whitesel, Conte & Saret

[57] ABSTRACT

The display plate includes a frame member having a rectangular flat portion provided with at least one opening shaped to accommodate a largest number of the plurality of light-emitting elements and a first and a second major surfaces which face each other, at least one pair of paired tongues protruding from the second major surface of the flat portion to face each other at a spacing and provided with at least two pairs of aligned openings, and at least two columnar lugs each being integrally fixed to one of the tongues in each pair in the at least one pair of paired tongues by a thin webbing. The frame member is made of a plastic. A thin designation card is fit on the first major surface of the flat portion of the frame member and formed with a plurality of openings which are associated in position with the light-emitting elements.

4 Claims, 5 Drawing Sheets

4,760,659

DISPLAY PLATE FOR A PRINTED CIRCUIT BOARD

BACKGROUND OF THE INVENTION

The present invention relates to a display plate for a printed circuit board.

Usually, a printed circuit board or card is loaded with various kinds of circuit elements on a surface of its base, or substrate, and provided at a first end or rear end of the base with connection members or male connectors adapted for connection with connection members or female connectors of communication equipment. At a second end or front end as opposed by the first end, the board is equipped with a plate member which basically serves as a handle for easily handling the board and as a stiffener for preventing deformation of the board, particularly bending. To implement such dual functions, the plate member is fixed to the front end of the base by screws, rivets and other individual fasteners. Further, the plate member functions as display means for providing visible indications of particular operating conditions of a circuit which is loaded on the board. An example of a printed circuit board with such display means is disclosed in U.S. Pat. No. 3,573,558. However, in the disclosed display means, or display unit 10 as shown in FIG. 1 of the patent, assembly work is difficult because the display means is fixed to the front end of a printed circuit board by means of a plurality of rivets. In addition, different kinds of such display means have to be prepared to cope with differences in the number of light-emitting elements, informations to be displayed, and the like, inviting a considerable decrease in productivity.

SUMMARY OF THE INVENTION

It is therefore an object of the present invention to provide a display plate which eliminates the drawbacks particular to the prior art structure as discussed above and can be easily fixed to a printed circuit board.

It is another object of the present invention to provide a display plate which is commonly applicable to various numbers and mounting positions of light-emitting display elements as well as various kinds of contents to be displayed.

It is another object of the present invention to provide a display unit which offers unprecedented productivity.

According to one aspect of the present invention, there is provided a display plate applicable to a printed circuit board of the type which carries at one end thereof a plurality of light-emitting elements for providing visible representations of operating conditions of a circuit loaded on the board and is formed with a plurality of openings at the one end. The display plate includes a frame member having a rectangular flat portion provided with at least one opening shaped to accommodate a largest number of the plurality of light-emitting elements and a first and a second major surfaces which face each other, at least one pair of paired tongues protruding from the second major surface of the flat portion to face each other at a spacing and provided with at least two pairs of aligned openings, and at least two columnar lugs each being integrally fixed to one of the tongues in each pair in the at least one pair of paired tongues by a thin webbing. The frame member is made of a plastic. A thin designation card is fit on the first major surface of the flat portion of the frame member and formed with a plurality of openings which are associated in position with the light-emitting elements which are actually arranged on the one end of the printed circuit board, representations indicative of contents which are assigned to the light-emitting elements being provided on the designation card adjacent to those openings, respectively. When the one end of the board is to be rigidly fit between the tongues in each of the pairs of the frame member, the columnar lug associated with the pair is separated from the thin webbing associated therewith to be received in the openings of the tongues and the opening of the board.

BRIEF DESCRIPTION OF THE DRAWINGS

In the drawings, identical reference numerals denote identical structural elements.

DESCRIPTION OF THE PREFERRED EMBODIMENTS

Figure 1:
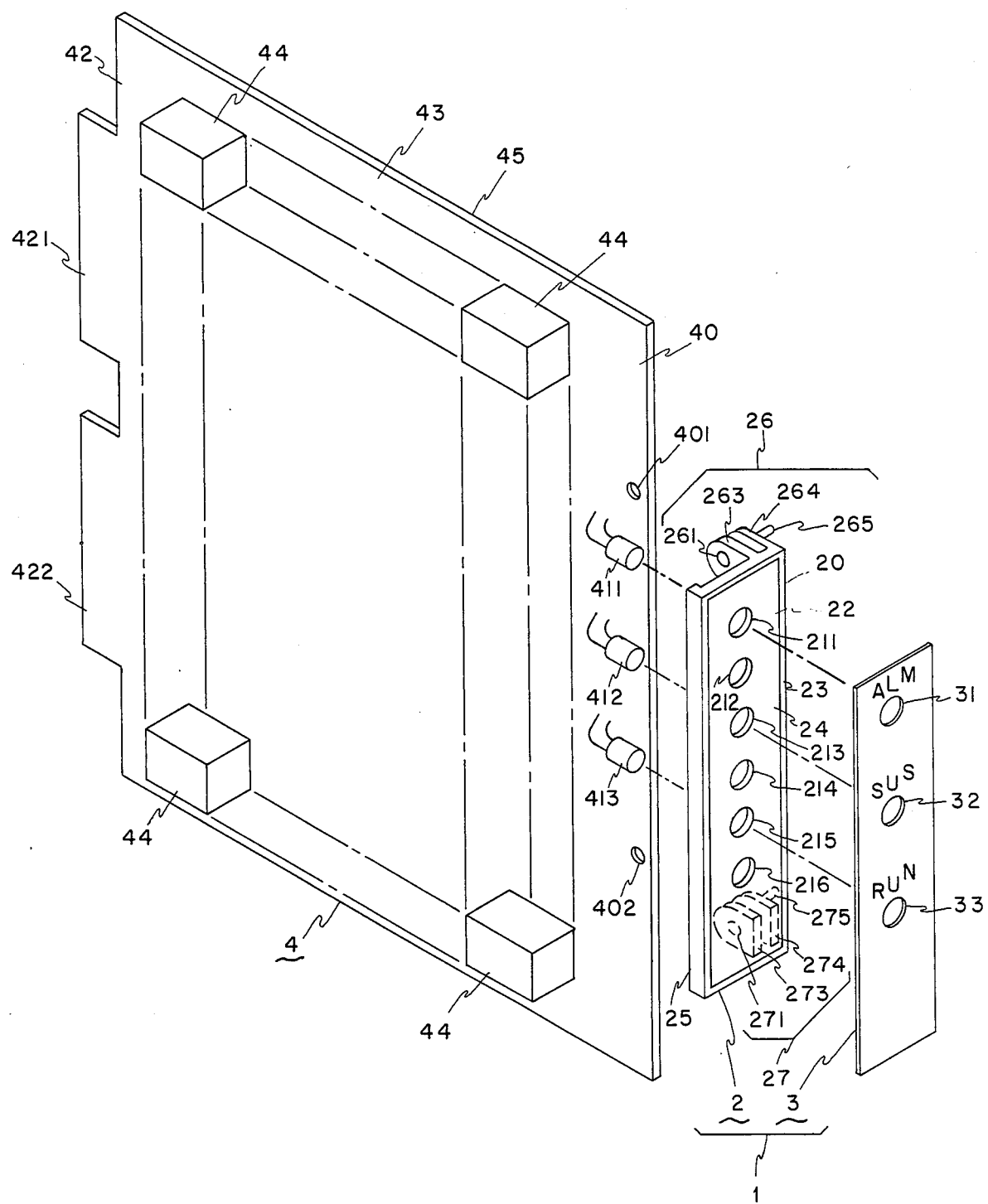
FIG. 1 is an exploded perspective view of a display plate in accordance with a first embodiment of the invention.

Referring to FIGS. 1, 2, 3A, 3B and 4, a display plate 1 in accordance with a first embodiment of the invention is shown and comprises a frame member 2 made of a plastic, and a thin designation card or designation film 3 also made of a plastic. The display plate 1 is rigidly mounted on a first end or front end 40 of a printed circuit package board 4.

The frame member 2 of the display plate 1 includes a rectangular flat portion 20 which is formed with six circular through openings 211, 212, 213, 214, 215 and 216. Three of those openings, i.e., openings 211, 213 and 215 correspond in position respectively to three light-emitting display elements 411, 412 and 413 which are mounted on the board 4. On a first major surface 22 of the flat portion 20, contiguous elongate projections, or ridges, 23 define a recess 24. A first mounting portion 26 and a second mounting portion 27 are molded integrally with the flat portion 20 to protrude respectively from a first and a second corners of a second major surface 25. The first mounting portion 26 includes a pair of tongues 263 and 264 which respectively are provided with aligned openings 261 and 262 and spaced from each other by a predetermined distance, which is substantially equal to the thickness of the board 4. A cylindrical lug 265 is formed integrally with the tongue 264 and coaxially with the openings 261 and 262 to protrude outwardly from the tongue 264. The lug 265 is connected to the tongue 264 by a thin annular webbing 266. Likewise, the second mounting portion 27 includes a pair of tongues 273 and 274 which respectively are provided with coaxial openings 271 and 272 and spaced from each other by a predetermined distance. A cylindrical lug 275 protrudes outwardly from the tongue 274 via a thin annular webbing 276 and coaxially with the openings 271 and 272.

The thin designation card 3 of the display plate 1 is formed with three circular openings 31, 32 and 33. Characters or symbols, "ALM", "SUS" and "RUN" in the illustrative embodiment, are printed on the designation card 3 adjacent to the upper ends of the openings 31, 32 and 33 to show what the display elements 411, 412 and 413 mounted on the board 4 represent. The designation card 3 is rigidly connected to the bottom of the recess 24 by means of adhesive. The display plate 1 with the card 3 bonded to the frame member 2 is shown in FIG. 2. Comparing the condition of the plate 1 before assembly shown in FIG. 1 and that after assembly shown in FIG. 2, it will be seen that the first, third and fifth openings 211, 213 and 215 out of the six openings 211, 212, 213, 214, 215 and 216 correspond respectively to the three openings 31, 32 and 33 of the card 3, while the other openings 212, 214 and 216 which are not used are masked by the card 3.

Figure 2:
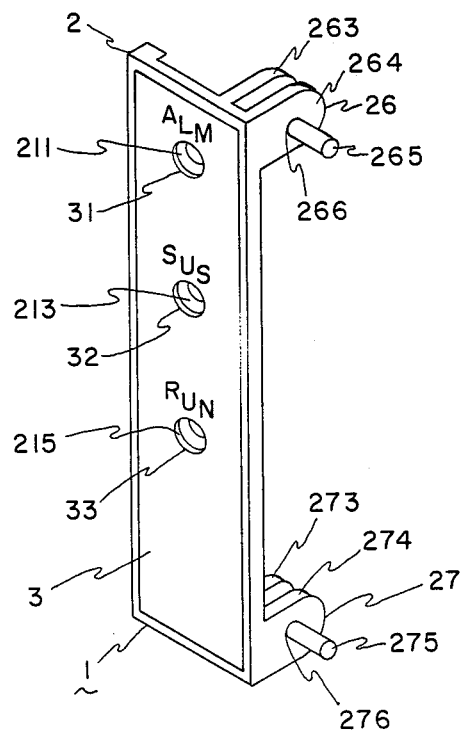
FIG. 2 is a perspective view of the display plate shown in FIG. 1.

As shown in FIG. 1, the printed circuit board 4 is provided with two through openings 401 and 402 at the first end 40 to which the display plate 1 is fixed. At a second end 42 opposite to the first end 40, the board 4 is provided with a pair of male connectors 421 and 422. Mounted on a first major surface 43 of the board 4 are various circuit elements 44 as well as the display elements 411, 412 and 413. A conductive pattern (not shown) which electrically interconnects the male connectors 421 and 422, the circuit elements 44, and the display elements 411, 412 and 413 is printed on a second major surface 45 of the board 4.

Figure 3A:
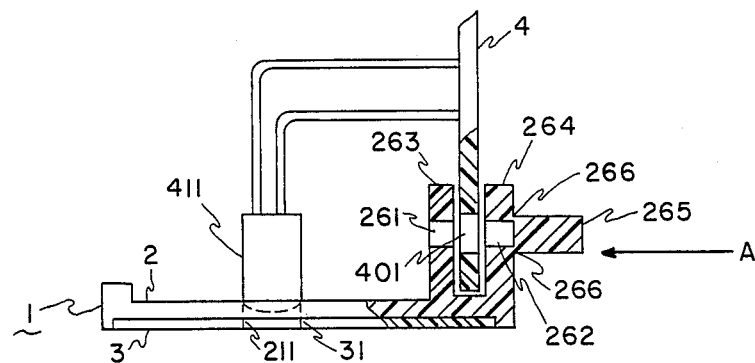
FIGS. 3A and 3B are sectional views showing a procedure for assembling the display plate and a printed circuit board which are shown in FIG. 1.
Figure 3B:
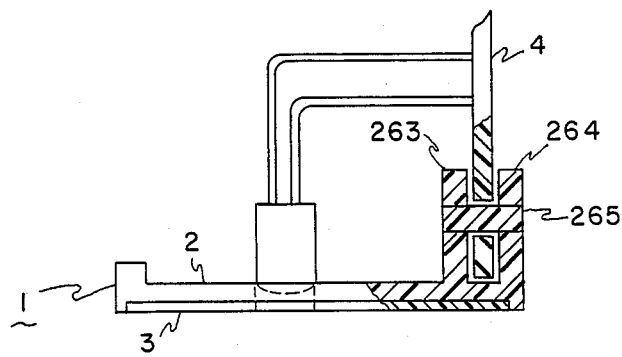
Figure 4:
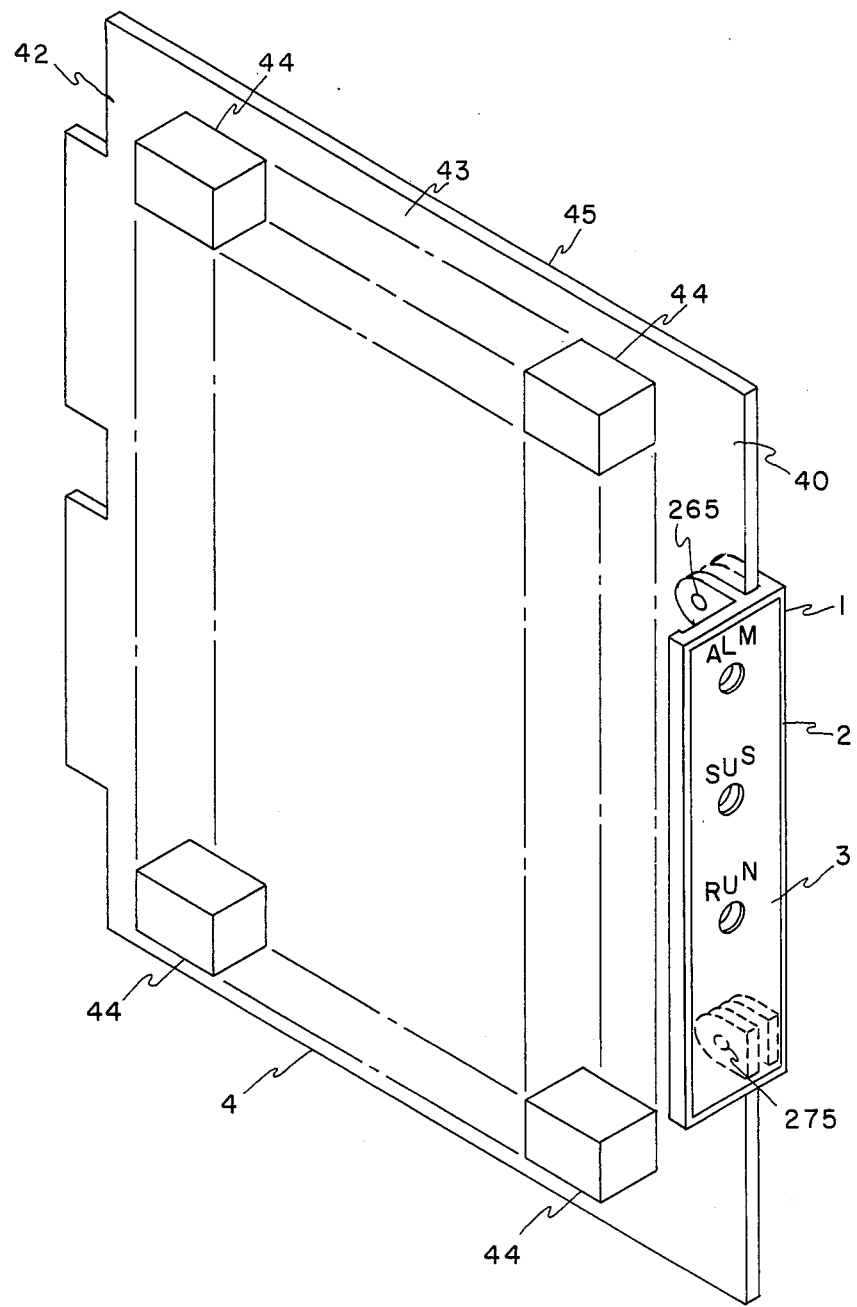
FIG. 4 is a perspective view of the display plate which is fixed to the printed circuit board.

The display plate 1 is fixed to the printed circuit board 4 having the above structure in the following manner. First, the first end 40 of the board 4 is inserted into the spacing between the tongues 263 and 264 of the first mounting portion 26 of the plate 1 and the spacing between the tongues 273 and 274 of the second mounting portion 27. At this instant, the board 4 is so positioned as to bring the opening 401 at the first end 40 thereof into alignment with the openings 261 and 262 of the tongues 263 and 264 (see FIG. 3A), and the opening 402 into alignment with the openings 271 and 272 of the tongues 273 and 274. Then, the cylindrical lugs 265 and 275 extending out from the tongues 264 and 274 via the thin webbings 266 and 276, respectively, are pressed in a direction indicated by an arrow A in FIG. 3A by finger or by a suitable hard material. As a result, as shown in FIG. 3B, the lug 265 is easily separated from the tongue 264 along the webbing 266 to be thrusted into the aligned openings 261, 262 and 401. The other lug 275 is pressed into the aligned openings 271, 272 and 402 in the same manner, although not shown in the drawings. By such a procedure, the display plate 1 is rigidly connected to the first end 40 of the board 4, as shown in FIG. 4. Here, it is important that the outside diameter ($a_1$) of the lugs 265 and 275 be designed slightly greater than the inside diameter ($a_2$) of the openings 261, 262, 271 and 272 to insure firm fit. Preferably, the outside diameter ($a_1$) of the lugs 265 and 275 is made slightly smaller than the inside diameter ($a_3$) of the openings 401 and 402, considering the coefficient of thermal expansion of the lugs 265 and 275 which is greater than that of the board 4.

Figure 5:
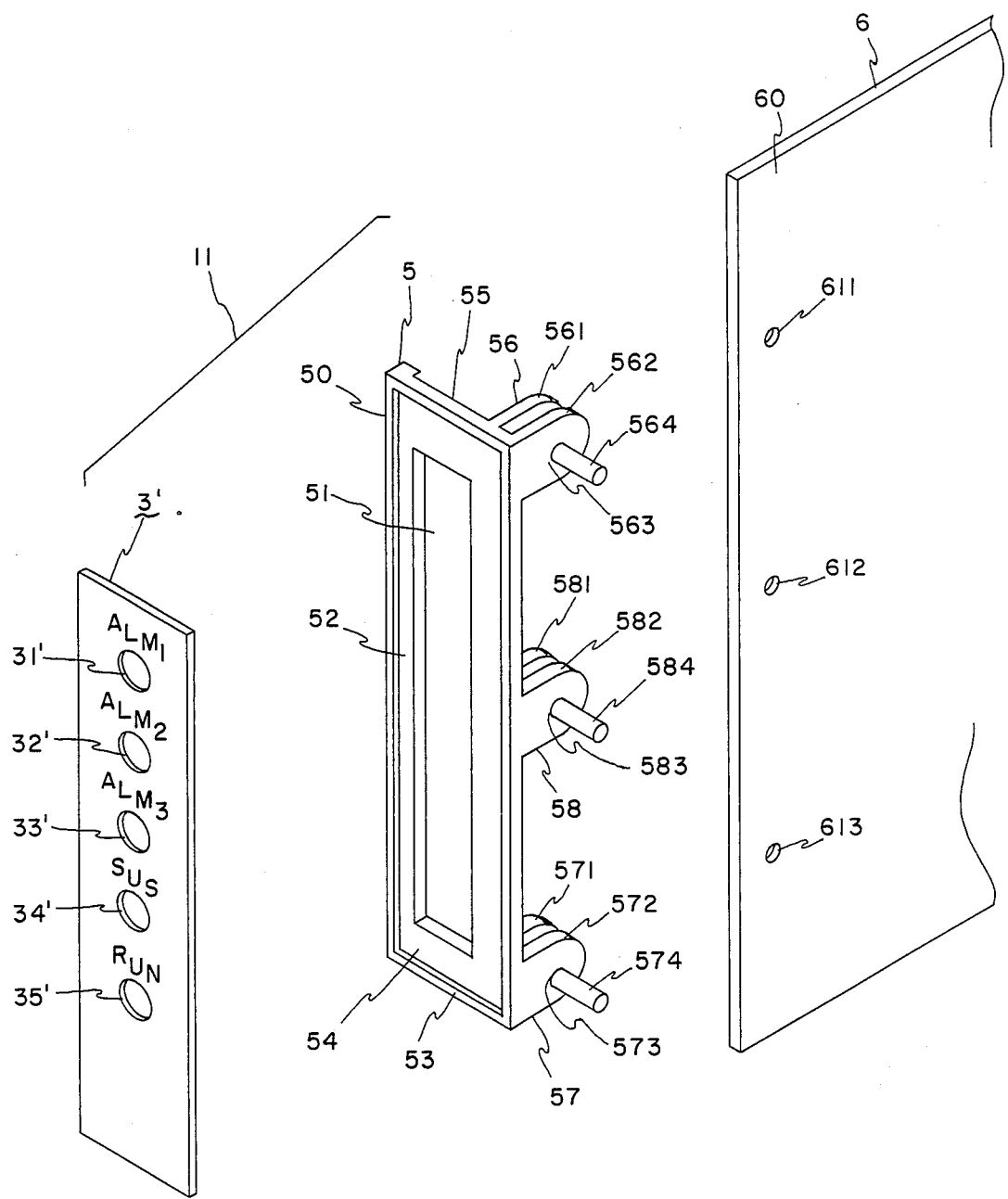
FIG. 5 is an exploded perspective view of a second embodiment of the invention.

Referring to FIG. 5, a display plate 11 in accordance with a second embodiment of the present invention is shown. As shown, the display plate 11 comprises a thin designation card 3' and a frame member 5. The card 3' is provided with five circular openings 31', 32', 33', 34' and 35', and characters or symbols above and adjacent to those openings to show contents associated with five display elements (not shown), i.e. "ALM 1", "ALM 2", "ALM 3", "SUS" and "RUN". The frame member 5 includes a rectangular flat portion 50 which is formed with a single rectangular slot 51. While the slot 51 is basically dimensioned to accommodate all the display elements which are mounted on a first end 60 of a printed circuit board 6, it in this particular embodiment accommodates five display elements. Contiguous elongate projections 53 are provided on a first major surface 52 of the flat portion 50 to define a recess 54. The card 3' is adhered to the bottom of the recess 54. A first mounting portion 56, a second mounting portion 57 and a third mounting portion 58 are molded integrally with the flat portion 50 to protrude respectively from a first corner, a second corner and an intermediate portion between the first and the second corners. The first mounting portion 56 is provided with a pair of tongues 561 and 562, the second mounting portion 57 a pair of tongues 571 and 572, and the third mounting portion 58 a pair of tongues 581 and 582, the tongues in each pair being spaced a predetermined distance from each other. Cylindrical lugs 564, 574 and 584 extend out respectively from the tongues 562, 572 and 582 via thin annular webbings 563, 573 and 583. The display plate 11 having such a construction is fixed to the first end 60 of the board 6 by thrusting the lugs 564, 574 and 584 as previously described in relation to the first embodiment. For this purpose, the tongues 561, 562, 571, 572, 581 and 582 are each provided with coaxial openings for receiving an associated one of the lugs 564, 574 and 584.

The display plate 11 in this particular embodiment can be fixed further firmly to the board 6 by virtue of the cooperation of the three pairs of tongues 561, 562, 571, 572, 581 and 582 and the three cylindrical lugs 564, 574 and 584. In addition, the single slot 51 of the frame member 5 capable of accommodating all the display elements which are mounted on the board 6 promotes the ease of production.

Figure 6:
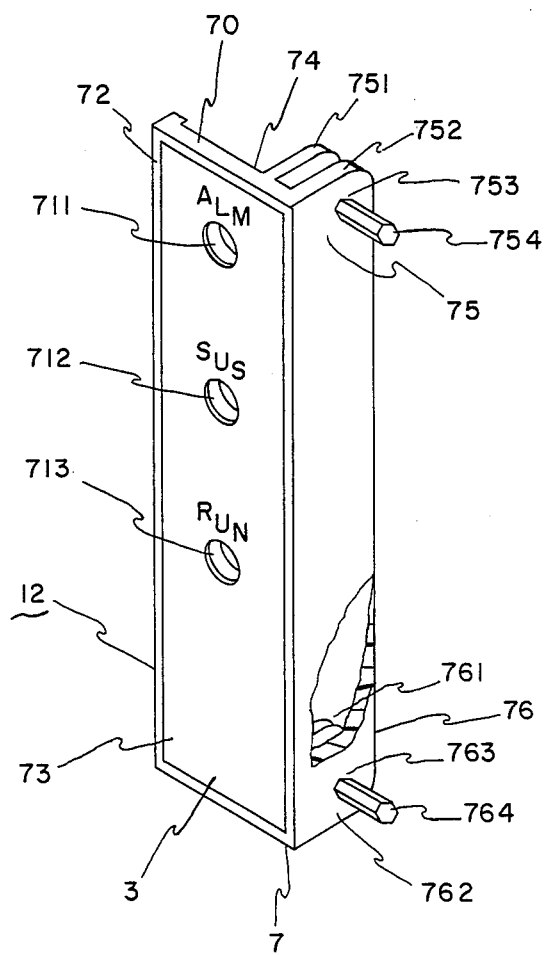
FIG. 6 is a partly perspective view of a third embodiment of the invention.

Referring to FIG. 6, a third embodiment of the present invention is shown. In this particular embodiment, a display plate, generally 12, includes a thin designation card 3 which is configured in the same manner as that of the first embodiment and bonded to the bottom of a recess 73, which is defined on a first major surface 72 of a frame member 7 that is made of a plastic. The frame member 7 is formed with three circular openings 711, 712 and 713 throughout a rectangular flat portion thereof. A first mounting portion 75 and a second mounting portion 76 are molded integrally with the flat portion 70 to protrude from a second major surface 74 of the flat portion 70. The first mounting portion 75 includes a pair of tongues 751 and 752 which are spaced a predetermined distance from each other, and the second mounting portion 76 a pair of tongues 761 and 762. In this particular embodiment, the tongues 752 and 762 are physically contiguous with each other in order to enhance reinforcement of the frame member 7. Prismatic lugs 754 and 764 are integrally connected to the tongues 752 and 762 via thin webbings 753 and 763, respectively. The display plate 12 constructed as described above is fixed to the first end 40 of the printed circuit board 4 by means of the lugs 754 and 764 which respectively are fit in the openings 401 and 402 of the board 4 (see FIG. 1). Although not shown in the drawing, each of the tongues 751, 752, 761 and 762 is provided with a circular opening which is coaxial with its associated lug 754 or 764. Alternatively, those openings of the tongues 751, 752, 761 and 762 may be shaped complimentary to the prismatic configuration of the lugs 754 and 764 of the frame member 7.

Figure 7:
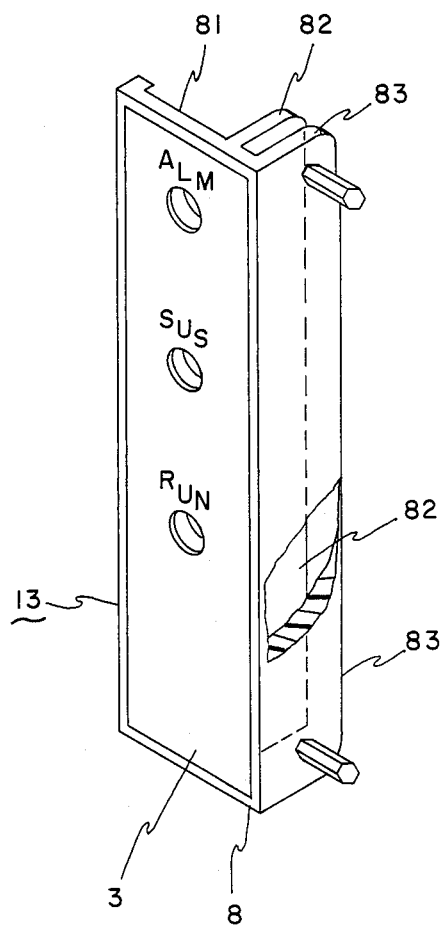
FIG. 7 is a partly broken perspective view of a fourth embodiment of the invention.

Referring to FIG. 7, a fourth embodiment of the present invention is shown. A display plate 13 in accordance with this embodiment includes a pair of plate-like tongues 82 and 83 which are provided on a second major surface 81 of a rectangular flat portion 80 of a frame member 8 to face each other at a predetermined spacing. Such a tongue configuration enhances firm connection of the display plate 13 to the printed circuit board 4 (see FIG. 1) and the reinforcement of the frame member 8. The rest of the construction shown in FIG. 7 is the same as the third embodiment.

In summary, it will be seen that the present invention provides a display plate which accommodates different numbers and different mounting positions of light emitting display elements as well as different contents to be displayed by using the same frame member and modifying a machinable and low-cost thin designation card. Such considerably enhances efficient production of such display plates.

Other alternatives and modifications to the above-mentioned embodiments can be made within the scope of the invention defined by the appended claims.

What is claimed is:

1. A display plate for a printed circuit board which carries at one end thereof a plurality of light-emitting elements for providing visible representations of operating conditions of a circuit which is mounted on the printed circuit board, the display plate being formed with a plurality of openings at said one end, said display plate comprising:
    a frame member having a rectangular flat portion provided with a plurality of openings which are positioned to accommodate a predetermined number of a plurality of light-emitting elements which could be fixed on the printed circuit board and having first and second major surfaces which face each other, at least two spaced pairs of tongues protruding from said second major surface of said flat portion, at least two pairs of aligned openings formed in said tongues, and at least two columnar lugs, each of said lugs being integrally fixed by a thin webbing on one of the tongues in each pair of tongues, said frame member being made of a plastic; and
    a thin designation card fitting on the first major surface of the flat portion of the frame member and formed with a plurality of openings which correspond to positions of the light-emitting elements which are actually arranged on the one end of the printed circuit board, representations indicative of operating conditions which are assigned to the light-emitting elements, said representations being provided on said designation card adjacent to said openings, respectively, the card masking any remaining openings in said plurality of openings provided at the flat portion which remaining openings are not actually used to accommodate said light emitting elements;
    whereby when said one end of the board is to be rigidly fit between the tongues in each of the pairs of the frame member, the columnary lug associated with said pair is separated from the thin webbing associated therewith to be received in the openings of said tongues and the opening of the board.

2. The display plate as claim in claim 1, wherein the columnar lugs of the frame member are cylindrical.

3. The display plate as claimed in claim 1, wherein the columnar lugs of the frame member are prismatic.

4. The display plate as claimed in claim 1, wherein contiguous elongate projections are provided on the first major surface of the flat portion of the frame member to define a recess on the first major surface, and the designation card is accommodated in said recess.

* * * * *